United States Patent [19]

Ong

[11] Patent Number: 5,548,549
[45] Date of Patent: *Aug. 20, 1996

[54] METHOD AND DEVICE FOR IMPROVED PROGRAMMING THRESHOLD VOLTAGE DISTRIBUTION IN ELECTRICALLY PROGRAMMABLE READ ONLY MEMORY ARRAY

[75] Inventor: Tong-Chern Ong, San Jose, Calif.

[73] Assignee: Intel Corporation, Santa Clara, Calif.

[ * ] Notice: The term of this patent shall not extend beyond the expiration date of Pat. No. 5,422,845.

[21] Appl. No.: 399,777

[22] Filed: Mar. 7, 1995

Related U.S. Application Data

[63] Continuation of Ser. No. 129,986, Sep. 30, 1993, Pat. No. 5,422,845.

[51] Int. Cl.$^6$ ..................................................... G11C 11/34
[52] U.S. Cl. ..................... 365/185.05; 365/63; 365/104; 365/174
[58] Field of Search .............................. 365/185, 63, 100, 365/104, 71, 148, 159, 174, 185.05

[56] References Cited

U.S. PATENT DOCUMENTS

| | | | |
|---|---|---|---|
| 4,709,352 | 11/1987 | Kitazawa | 365/104 |
| 5,010,520 | 4/1991 | Minagawa et al. | 365/174 |
| 5,204,834 | 4/1993 | Ochii et al. | 365/154 |
| 5,218,571 | 6/1993 | Norris | 365/189.09 |
| 5,422,845 | 6/1995 | Ong | 365/185 |

FOREIGN PATENT DOCUMENTS 62-12997  1/1987  Japan .

*Primary Examiner*—Son Dinh
*Attorney, Agent, or Firm*—Blakely, Sokoloff, Taylor & Zafman

[57] ABSTRACT

A method and device to compensate for the series resistance effect along, for example, the source region in an electrically programmable read only memory array is described. One or more resistors are provided between the ground contact and ground. When a cell is programmed, the source is coupled to ground through one or more of the resistors, such that the resistance between source and ground for all cells is approximately equal. Therefore, the potential of the source of each cell is approximately equal for all cells during programming. In this way, the potential difference between the control gate and source is approximately equal for every cell, thereby resulting in more uniform programming levels and therefore more uniform threshold voltages. The method and device of the present invention is particularly applicable to multi-level cells, which employ several different threshold voltages to represent several different logic states. In addition to providing for uniform threshold voltages, the resistors of the present invention can be used to provide for programming to different levels using a single programming voltage on the control gate. For each level, the source of a cell is coupled to ground through one or more resistors, such that the potential difference between the control gate and the source has the appropriate value for that level.

11 Claims, 4 Drawing Sheets

METHOD AND DEVICE FOR IMPROVED PROGRAMMING THRESHOLD VOLTAGE DISTRIBUTION IN ELECTRICALLY PROGRAMMABLE READ ONLY MEMORY ARRAY

This is a continuation of application Ser. No. 08/129,986, filed Sep. 30 1993, now U.S. Pat. No. 5,422,845

BACKGROUND OF THE INVENTION

1. Field of the Invention

The present invention relates to electrically programmable read only memory devices, and more particularly to a method and apparatus for improved programming threshold voltage distribution.

2. Background Information

The fabrication of erasable programmable read only memories (EPROMs) utilizing metal-oxide-semiconductor (MOS) technology is well known in the art. The EPROMs employ an array of memory cells utilizing floating gates which are generally formed from polysilicon members completely surrounded by an insulator. Electrical charge is transferred into the floating gate using a variety of techniques such as avalanche injection, channel injection, Fowler-Nordheim tunneling, etc. EPROMs are erased by various phenomena including exposing the memory array to ultraviolet radiation to remove the charge. Electrically erasable read only memories (EEPROMs) were developed to provide the capability of electrically erasing programmed memory cells. Typically, each cell of an EEPROM comprises two or more transistors and can be individually erased. Another type of electrically erasable floating gate memory which uses a single transistor per cell is the "flash" EPROM, wherein the entire array, or an entire block of memory cells is electrically erased at a time.

FIG. 1 shows a portion of a flash memory array employing a typical NOR type architecture. In this array, a plurality of cells, for example sixteen cells, are arranged in a row. One such row 100 a comprises memory cells C101a–C116a. It will be appreciated that each row can comprise a greater or lesser number of cells. A second row 100b of cells C101b–C116b is also shown. Each cell, such as cell C101a comprises drain D101a, floating gate FG101a, source S101a, and control gate CG101a. Each drain in the array has its own contact, and the drains of each column of cells (e.g., cells C101a, C101b, etc.) are coupled in parallel by an overlying metal layer. In this array, the source is a single, elongated diffusion region, shared by all cells in the row. That is, cells C101a–C116a share a common source. Additionally, as can be seen from the Figure, this source diffusion region is also shared by row 100b immediately below. As shown, each row shares common ground contacts 110a and 110b on both sides of the source diffusion. The common ground contact is utilized to save area compared with an architecture wherein each source has a ground contact. While the diffusion region is conductive, it has a sufficiently high resistance such that a significant voltage drop occurs between each cell when a current flows. This resistance is illustrated by individual resistors in the Figures. It will be understood that the resistors are present for illustration purposes only, and are used to represent the resistance between each cell along the source diffusion. The resistance between each cell is typically in the range of approximately 80–150Ω. Typically, the two $V_{ss}$ lines shown are shorted together and coupled to ground.

In order to program one of the cells, for example cell C101a, a programming voltage, of, for example, 10–12 volts is applied to control gate CG101a via contact 115a, while a voltage of approximately 5–7 volts is applied to drain D101a, while source S101a is grounded. Note that none of the other cells in row 100a will be programmed, because no voltage is applied to their drains. Similarly, cell C101b or other cells in the same column as C101a will not be programmed, because no programming voltage is applied to their control gate 115b, and thus these transistors are off.

One problem that occurs in an array such as that shown in FIG. 1 is known as the series resistance effect along the source diffusion, which causes the programming threshold voltage and the read current to be non-uniform across an array. The series resistance effect arises because the resistance, and therefore the voltage drop, between a source and ground varies depending upon a cell's position in the row. Therefore, the potential difference during programming varies from cell to cell. For example, when programming cell C101a, with a given control gate and drain voltage, the potential difference between the control gate CG101a and source S101a, and between drain D101a and source S101a will depend upon the potential of the source, which in turn depends upon the programming current and the resistance between source C101a and ground. Assuming for purposes of illustration, that the resistance between each cell and between the end cells and the ground contact has a value of R, the equivalent resistance between source S101a and ground, Req, is $$\frac{1}{Req} = \frac{1}{R} + \frac{1}{16R} \; ; Req \approx .94 R$$

For a cell in the middle, such as cell C108a, the equivalent resistance will be much greater, as there is a resistance of 8R and 9R between cell C108a and ground contacts 110a and 110b, respectively, for an equivalent resistance of approximately 4.24R. Thus, the voltage drop between the source and ground is over four times as great for cell C108a as for C101a. Therefore, the source of cell C101a is at a lower potential (i.e., closer to ground) than the source of cell C108a. Thus, the potential difference between control gate CG101a and source S101a, and the potential difference between drain D101a and source S101a, will be greater than the corresponding potential differences between control gate CG108a and source S108a, and between drain D108a and source S108a of cell C108a, for example. This decreased potential difference, particularly the control gate-source potential difference, of the cells in the middle, such as cell C108a, causes the floating gates of such cells to be charged to a lesser level than the floating gate of cell C101a, for example. This results in a larger threshold voltage and smaller read current for the cells farthest from the ground contacts. In practice, in an army having 16 cells in a row with two ground contacts, the difference in threshold voltage between a cell in the middle and one immediately next to the ground can vary in the range of approximately 0.5–1 Volt. Thus, one cell may be sensed to fall into one logic state while another cell is sensed to fall into another logic state, even though both are programmed with the same voltages on the control gate and drain. This is particularly important in multi-level cell architecture, where the floating gates are programmed to several different levels so that each cell can be used to store more than a single bit of information. In such a case, the threshold voltage between levels is considerably less than in a cell having only two states, and the difference in threshold voltage due to the series resistance effect is even more likely to cause a cell to be sensed in the wrong logic state. Additionally, cells that are programmed to higher threshold voltages, for example, the cells next to the $V_{ss}$ line, have more electrons on the floating gate, and, therefore, have a higher internal field after these cells are programmed. This high internal field will tend to pull electrons out of the floating gate and cause charge loss. This charge loss is a reliability concern in devices that store information in the form of electric charge such as floating gate MOS devices.

What is needed is a method and device to minimize the series resistance effect, so that every cell sees the same series resistance during programming and read. The method and device should provide for a more uniform threshold voltage distribution which is particularly desired in multi-level cell architecture. It is further desirable that the method and device provide for programming of several logic states in a cell, utilizing a single programming voltage.

SUMMARY OF THE INVENTION

A method and device for compensating for the series resistance effect to provide uniform threshold voltage distribution, and for providing multi-level logic states using a single programming voltage is disclosed. In one embodiment, an array of memory cells having a plurality of memory cells sharing a single contact, for example, the ground contact for the source, is provided with means for compensating for the series resistance effect. One or more resistors, with a switch between each resistor, is provided between the common ground contact and ground. In this way, the resistance between the ground contact and ground can be varied, according to the cell being programmed, such that the voltage drop between the source and ground for all cells is approximately equal. Each cell is therefore programmed to approximately the same level, regardless of its position along the common source. This results in uniform threshold voltage distribution and read current distribution. Additionally, charge retention is also improved. The method and device of the present invention also provides for programming to several levels utilizing a single programming voltage.

Other features and advantages of the present invention will be made apparent from the detailed description figures and claims which follow.

BRIEF DESCRIPTION OF THE DRAWINGS

The present invention is illustrated by way of example and not limitation in the accompanying figures in which.

DETAILED DESCRIPTION

A method and device for improved programming threshold voltage distribution in an electrically programmable read only memory array is disclosed. In the following description, numerous specific details are set forth such as specific devices, architectures, dimensions, voltages, resistor values, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

Figure 1:
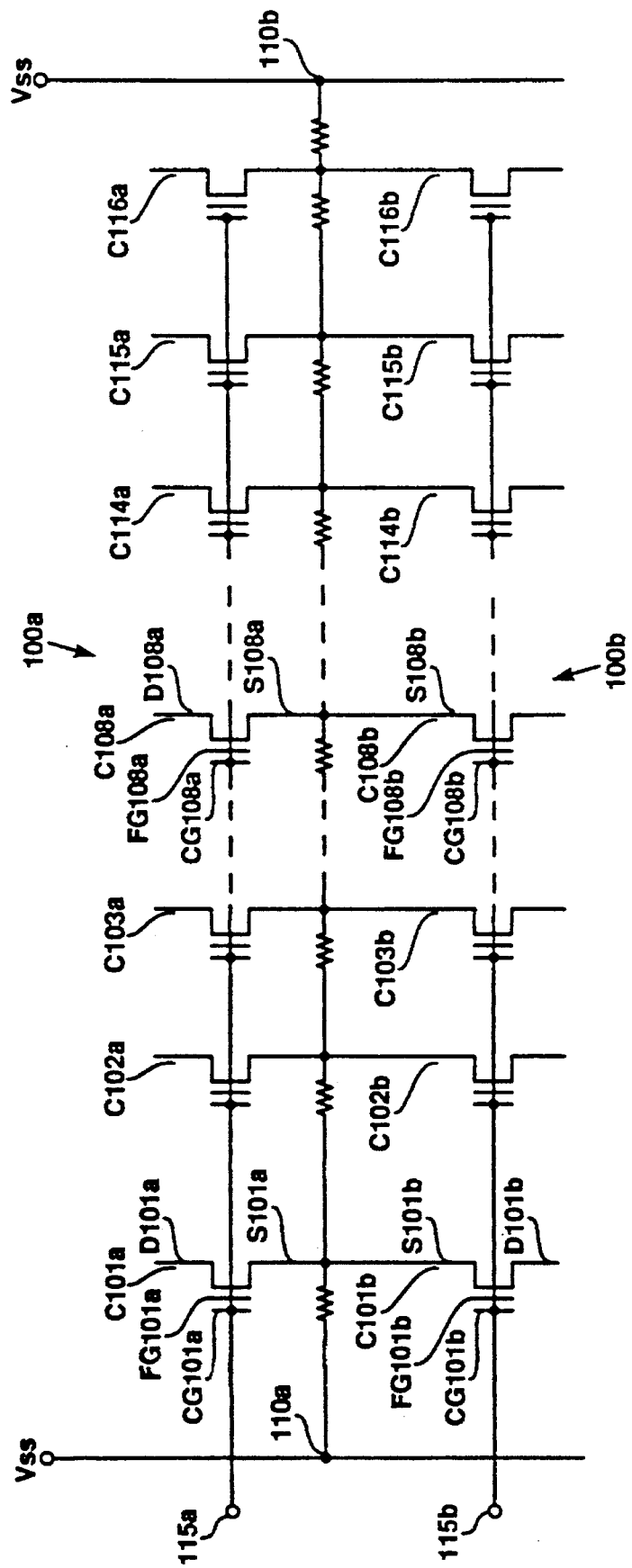
FIG. 1 shows a portion of an array of memory devices.
Figure 2:
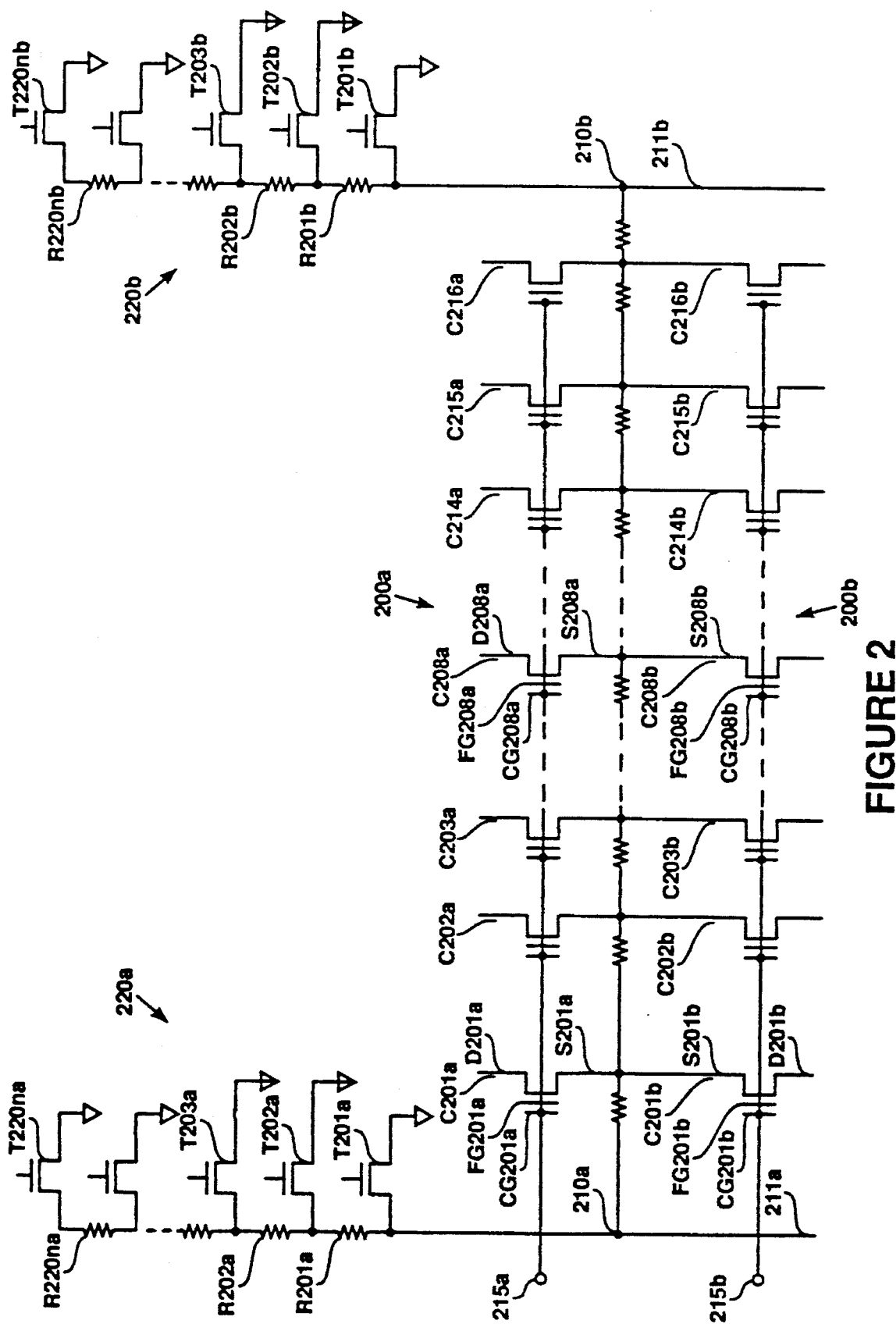
FIG. 2 shows a portion of an array of memory devices having a series of resistors and switches between the ground contact for the array and ground.

FIG. 2 shows an embodiment of the present invention. In FIG. 2, each row of cells 200a, 200b, etc. is generally similar to the rows of cells 100 of FIG. 1. As shown, each row 200 comprises 16 cells. As will be appreciated by one of skill in the art, each row could contain a greater or lesser number of cells. Additionally, as will be appreciated by one of skill in the art, there could be any number of such rows of cells 200 in each block of the array. As shown, each row of cells has a common ground contact 210a to $V_{ss}$ line 211a, and common ground contact 210b to $V_{ss}$ line 211b. In the present invention, each of $V_{ss}$ lines 211a and 211b are coupled to resistor steps 220a and 220b, respectively, which comprise a series of resistors and switches. In a currently preferred embodiment, each of the switches comprises a transistor. As shown, each of resistors R201–R220n is preceded and followed by one of transistors T201–T220n coupled to $V_{ss}$ line 211. Also in a currently preferred embodiment, each of the resistors in resistor strips 220 have a resistance in the range of approximately 80–150Ω, which is approximately the resistance between two adjacent sources.

In operation, resistor strips 220 are used to approximately equalize the voltage drop between the source of a cell and ground. To program a cell, a programming voltage of approximately 10–12 V is applied to control gate contact 215 while a second voltage of approximately 5–7 V is applied to the drain of the cell being programmed. In the present invention, the coupling between the source and ground during programming is made through one or more resistors on the strips 220a and 220b, by turning on the transistor following the last resistor through which the coupling to ground is to be made and turning off all other transistors. Illustrative methods of achieving an approximately equal source to ground resistance are given below. It will be appreciated that many variations of the described methods within the present invention may be used, and that the present invention is not limited to the specific connections described below. Further, the degree of equalization will depend upon the specific application, and an amount of equalization which constitutes an approximately equal resistance in one array may not be sufficiently equal in another. For example, as described earlier, it is desirable that a multi-level cell is programmed to very uniform levels so that a greater degree of equalization may be necessary. Similarly, small geometry cells may particularly benefit from more uniform source to ground resistance, since variations in programming levels due to the series resistance effect, and other effects, are typically more problematic. Typically, the source to ground resistance for all cells is adjusted to be approximately the same as that for a cell in the center of the array shown in FIG. 1, coupled directly to ground through both of common contacts 110 without going through any resistors. Alternatively, if desired, the source to ground resistance for all cells can be a higher value. For example, to program cell C208a, a programming voltage is applied to control gate CG208a via contact 215a, while a voltage is applied to drain D208a. Transistors T201a and T201b are turned on, while transistors T202a–T220na and T202b–T220nb are off. Thus, the source S208a of cell C208a is coupled to ground via transistors T201a and T201b which typically have a negligible resistance. Assuming that the resistance between the adjacent sources and between the source of the end cells and the ground contact is R, the equivalent resistance, Req, between the source S208a and ground can be found by:

$$\frac{1}{Req} = \frac{1}{8R} + \frac{1}{9R} \; ; Req = 4.24R$$

Now, to program cell C201a, the appropriate voltages are applied to control gate 215a and the drain for the column of cell C201a while all other drains are off. The source S201a is then grounded by, for example, turning off all transistors on strip 220a except for T205a, so that source S201a is grounded through resistors R201a–R204a, so that the resistance between source S201a and ground on one side is 5R. On the other side, connection to ground is made for example, by turning off all transistors on strip 220b except for transistor T213b, so that the path to ground on this side passes through the equivalent of 28R. In this way, the equivalent resistance can be found by:

$$\frac{1}{Req} = \frac{1}{5R} + \frac{1}{28R} \; ; Req = 4.24R$$

Thus, the resistance between source and ground for both cells C208 and C201 is approximately equal. In a similar manner, when any of the cells in any of the rows 200 of cells are programmed, one of the transistors in each of the resistor strips 220 is on while all others are off, the path to ground for a cell being chosen such that the equivalent resistance is the same for all cells. With the same source side resistance, the potential difference between each control gate and source during programming is approximately the same for every cell, resulting in a uniform source-control gate potential difference within an array. Furthermore, the potential difference between each drain and source during programming is also approximately the same for every cell. Therefore, each cell is programmed to approximately the same level.

To read one of the cells, the source is grounded while the control gate is brought to a read potential, of, for example, approximately 5 volts while the drain is brought to a potential of approximately 1 volt. Again, during read, the connection to ground can be made as described above during programming. In the present invention, the read current for a given level of programming will be more uniform primarily due to the fact that all cells programmed to that level have a uniform charge on the floating gate. Additionally, as with programming, the potential difference between the control gate and source, and between the drain and source, is more uniform during read compared with an array without resistor strips 200. This latter effect is not as significant in keeping the read currents uniform as is the fact that all cells have been programmed to a uniform level, since the read current is generally small, so that the voltage drop along the common source in all cases is relatively small.

As mentioned above, it will be appreciated that many variations to the above-described programming scheme can be utilized in the practice of the present invention. For example, each row 200 can be coupled to $V_{ss}$ on only one side of the row or the other (i.e., either contact 210a or 210b) with a single resistor strip 220. Referring briefly to FIG. 1, note that for the memory array shown therein, a single $V_{ss}$ arrangement would exacerbate the problem described in the Background section, since the source to ground resistance for cell C101a would remain at about 1R while the cell C116a would have a resistance of approximately 16R resulting in a resistance, and therefore a voltage drop, 16 times greater for cell C116a compared with cell C101a. Thus, in a single $V_{ss}$ array without the resistor strip of the present invention the total source to ground resistance of many of the cells would be much greater, and the variation in potential difference between the control gate and source would be much greater, than for the case shown in FIG. 1. In contrast, in the present invention, while use of only a single $V_{ss}$ line increases the resistance between the source and ground, that resistance remains uniform for all cells, albeit at a higher level. Note also in the cell of FIG. 1, increasing the number of cells per row will also increase the total source to ground resistance, and increase the variation in potential difference between the control gate and source from cell to cell. In the present invention, however, a greater number of cells per row may increase the worst-case source to ground resistance, but again the resistance remains uniform in the present invention. In some cases, the higher resistance may be desirable to increase the negative feedback effect, described below.

In a further embodiment of the present invention, the resistance for each of the parallel paths to ground is made to be equal for each cell. That is, assuming as before an array having 16 cells in a row, where the maximum resistance between a cell and a ground contact is 16R, each source is coupled to ground such that a resistance of 16R is encountered on each side. For example, cell C201a is coupled to ground via transistors T216a and T201b, cell C208a is coupled to ground via transistors T209a and T208b, cell C216a is coupled to ground via transistors T201a and T216b, etc., so that the resistance between source and ground is 16R on each side for an equivalent resistance of 8R for all cells. Many further embodiments of the present invention may also be realized. For example, the resistors do not necessarily need to have the same value as the resistance between cells. Also, it is not necessary to have a sufficient number of resistors to be able to exactly match the source to ground resistance for all cells. Any number of resistors along the $V_{ss}$ line with appropriate switching provides for a more uniform source side resistance compared with the memory cell of FIG. 1. For example, in an alternative embodiment a single resistor per side is used, with cells closest to the end of the row coupled to ground through the resistors on both sides, cells in the middle coupled to ground through a switch before the resistor on both sides, and cells between the end and middle coupled to ground through the resistor on one side only, for example. In such an embodiment, the source to ground resistance can be made more uniform if the single resistor has a resistance greater than the resistance between cells. Embodiments using fewer resistors than that shown in FIG. 2, with resistance values chosen to provide for maximum uniformity in source to ground resistance, have the advantage of minimizing the space needed for the resistor strips. It will also be appreciated that each resistor in the resistor strip 220 does not necessarily need to have the same value as the others. Additionally, many memory arrays may have a different layout than that shown in the Figures. For example, the resistance between the first and last memory cell and the ground contact may not be equal to the resistance between cells but may be a lesser or greater value. Additionally, the resistance from one cell to the next may vary. However, the resistance along the source diffusion is typically known, and the circuit designer can determine the number of resistors and the resistance of each resistance such that, with appropriate switching, a uniform resistance can be achieved, similar to the manner described above. It will be appreciated that only a couple of rows of cells are shown in the figures for the purposes of illustration, and that each row of the array, such as row 200a, does not require its own resistor strip 220. Rather as shown, each resistor strip 220 is coupled to a common $V_{ss}$ line, which is coupled to a ground contact for a large number of rows.

As briefly referred to above, a phenomenon known as the negative feedback effect occurs during the programming of a cell. As described generally herein, in a row of cells coupled to ground through a common ground contact, there is always some resistance between the source and the ground contact. The voltage drop across this resistance will be a product of the resistance times the current during programming. During manufacturing, there is typically some variation in the channel length from cell to cell. Cells with shorter channels will conduct more current during programming. However, since more current is conducted, the voltage drop between the source and ground is greater since the current is greater. Therefore, in a cell with a short channel, the potential difference between the control gate and source is less than a similarly positioned cell with a longer channel due to the greater voltage drop between source and ground. Thus, this negative feedback effect results in a smaller potential difference for cells having a greater programming current. This smaller potential causes less charge to be transferred to the floating gate than would be the case if there were no source side resistance. Thus, the negative feedback effect tends to cause cells with short channel lengths to be programmed to levels closer to that of the cells with longer channel lengths, resulting in a tighter distribution. In a memory array such as that shown in FIG. 1 however, this effect is not consistent from cell to cell. For example, the negative feedback effect would not be very strong for cell C101a as there is very little source to ground resistance. Conversely, the effect would be very strong for a cell in the middle such as cell C108a. Unfortunately, a cell with a short channel, for which a strong negative feedback effect is desired, may be at the end of a row, where the effect is not as strong, while a cell with a long channel, for which a strong negative feedback effect is not desired, may be in the middle of the row where the effect is strong. Therefore, the negative feedback effect may not be that helpful. In the present invention, since the source side resistance is approximately equal for all cells, the negative feedback effect is uniform and results in more uniform programming when there is a variation in channel length.

As described earlier, the present invention is particularly useful in multi-level cells, wherein each cell can be programmed to one of several different levels, which in the present invention can be read more reliably as a result of the more uniform programming levels and therefore threshold voltage distribution as described above. Typically, the multi-level programming is accomplished by providing for several different programming voltages to be applied to control gate 215a, to provide for several control gate-source potential differences, and therefore several different programming levels. The present invention can be further used to provide for multi-level programming using a single programming voltage. In the present invention, a plurality of control gate-source potential differences are provided by providing a plurality of different source potentials during programming. For example, for purposes of illustration, assume that each cell is programmed using the above described embodiment wherein connection to ground is made through an equal resistance on each of the two parallel paths to ground for each cell. For programming to a first, highest level, the source of a cell being programmed is coupled to ground by selecting transistors such that the source to ground resistance is 16R per side, for an equivalent resistance of 8R. Thus, for each cell the charge transferred to the floating gate will be determined by the potential difference between the control gate and the source and between the drain and the source, the source potential being approximately equal for all cells by virtue of the resistor strip 220 of the present invention. To program to a second, lower level, the source of each cell is coupled to ground through a greater number of resistors, for example, 20 on each side, for an equivalent source to ground resistance of 10R. In this case, the source potential will be greater than when a cell is programmed to the above described first level, resulting in a reduced control gate-source potential difference, so that the floating gate is charged to a lesser level. Similarly additional programming levels can be achieved by increasing the source to ground resistance. As stated above, the equal number of resistors per side embodiment has been described for ease of illustration. Typically, for programming to a first level, the resistance for each cell is made to be approximately equal to that of a middle cell grounded directly without going through any additional resistors, as described previously, and all other levels are achieved by adding to the total equivalent resistance by adding resistors on one or both sides, as necessary, such that the source to ground resistance is the same for every cell for each level. Again, use of the specific number of resistors having a resistance equal to the resistance between two sources as illustrated herein is not necessary and the circuit designer can design an appropriate number of resistors and resistance values of each resistors along the resistor strips 220, and appropriate switching schemes such that all cells have the same source side resistance for each level. Thus, the present invention can be used both to equalize the source side resistance for all cells, and to provide for different programming levels, each having a uniform control gate-source potential difference and therefore uniform programming at a plurality of levels.

Figure 3:
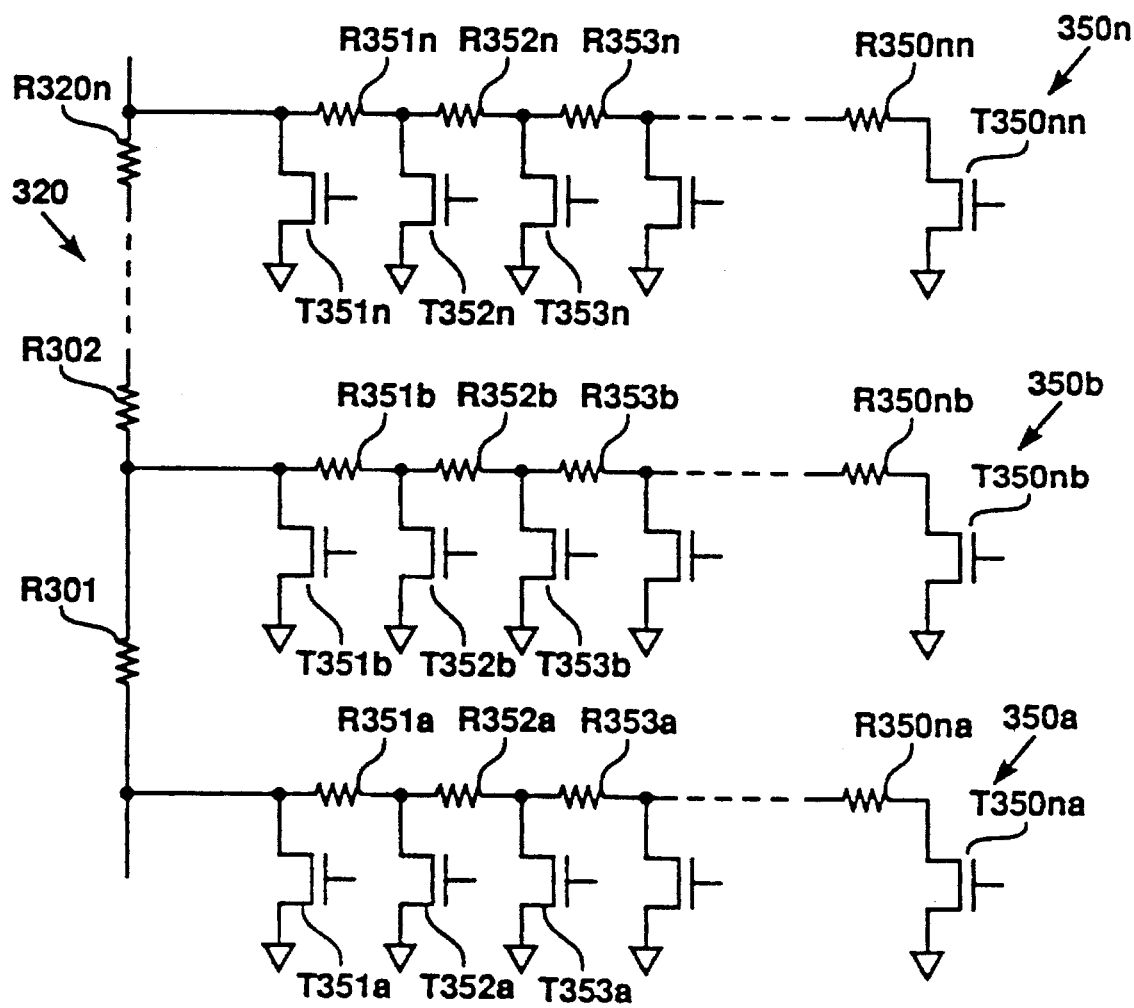
FIG. 3 shows a series of resistors as in FIG. 2, further having another series of resistors and switches coupled between each of the resistors.

FIG. 3 illustrates another embodiment of the present invention for achieving uniform threshold voltage by reducing the series resistance effect, and for providing a plurality of programming levels using a single voltage. In FIG. 3, a portion of a resistor strip 320, similar to one of the resistor strips 220, is shown. For purposes of illustration, it will be assumed that each of the common sources are coupled to a single $V_{ss}$ line by a common contact. In this case, the resistors R301, R302, etc. are used to compensate for the series resistance effect as described above. Each of programming resistor Strips 350a, 350b, etc. are then used to provide for programming to different levels. For example, in single level programming a cell such as cell C208 of FIG. 2 is programmed with its source connected to ground without going through any of the resistors in the resistor strip 220. In the embodiment of FIG. 3, a cell which does not need to go through any of the resistors in strip 320 is coupled to ground via resistor strip 350a. To program that cell to a first level, it is coupled to ground via transistor T351a by turning on transistor T351a while transistors T352a–T350na are off. (Additionally, all of the transistors in resistor strips 350b–350n are turned off. ) To program that same cell to a second level the source of the cell is coupled to ground via transistor T352a by turning on transistor T352a while all other transistors in resistor strip 350a (and all transistors in all other resistor strips) are off. In this way, the source to ground path includes resistor R351a, which results in a reduced potential difference between the source and control gate as described previously, resulting in programming to a different level. Similarly, the cell is programmed to up to n levels by appropriately turning on one of the transistors T351a–T350na while all others off, and thus adding one or more of the resistors in resistors strip 350a in the path between the source and ground. In a similar manner, a cell for which the source to ground path includes resistor R301 in order to compensate for the series resistance, will be coupled to ground via resistor strip 350b, by turning on one of the transistors T351b–T350nb, while all other transistors in strip 350b, and all transistors in the other resistor strips 350a, and 350c–350n are off. For example, to program that cell to a first level transistor T351b is on, while T352b–T350nb (and all transistors in all other resistor strips) are off. Again, for other levels the appropriate transistor is on while all others are off. To program all cells to the same level in the above described embodiment having a single ground contact coupled to a single resistor strip 320, with the resistors R301–R320n compensating for the series resistance effect, each resistor R351a–R351n must have approximately the same value, and each resistor R352a–R352n must have approximately the same value, and so on. However, it will be appreciated that the resistors 351, 352, 353, etc. need not have the same resistance value as each other, but have resistance values determined by the desired potential difference between the control gate (and drain) and source for a given level. Typically, the value of the resistors in the strips 350 is equal to or greater than the resistance between cells and the resistance of compensating resistors in the strips 320 or 220, and is in the range of approximately 100Ω to several thousand ohms.

Figure 4:
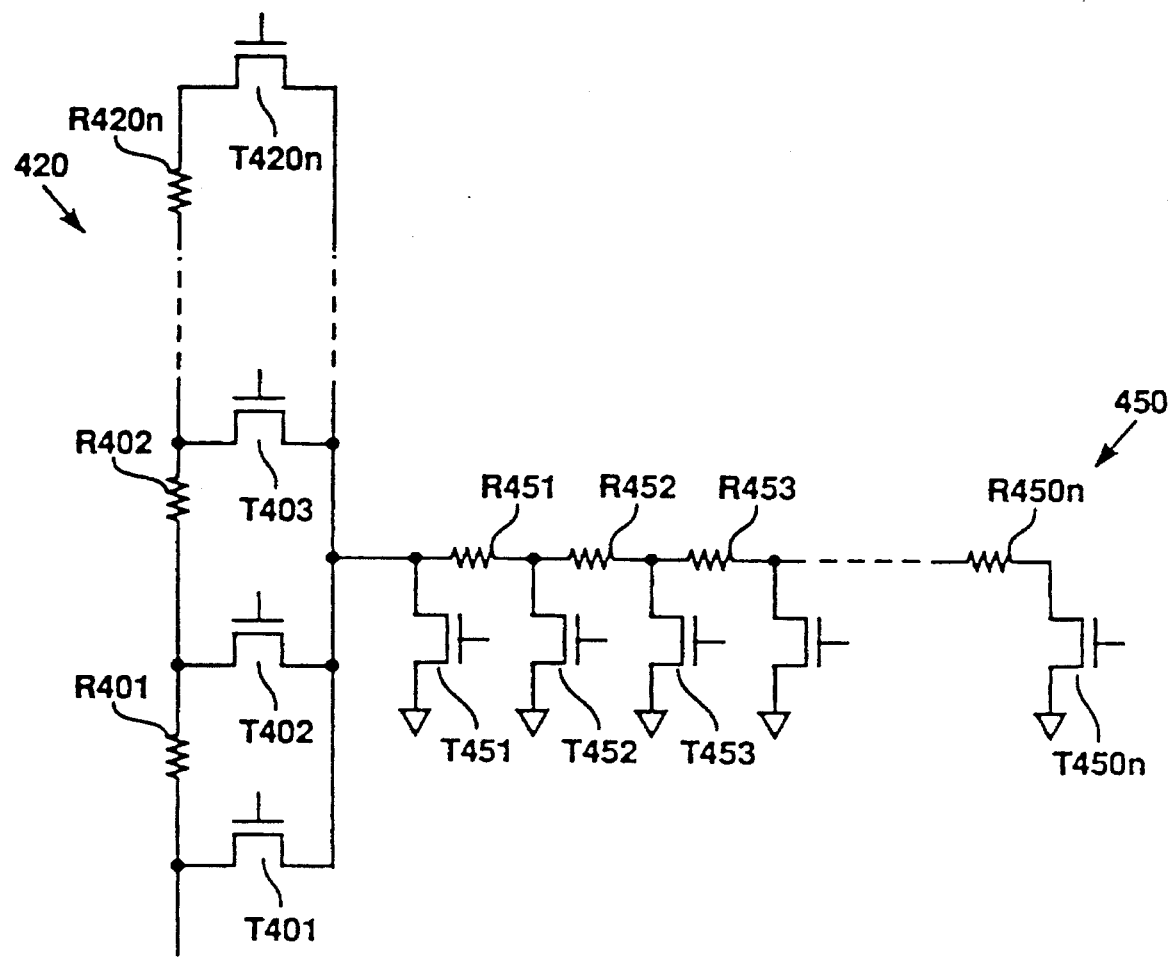
FIG. 4 shows a series of resistors and switches as in FIG. 2 further coupled to another series of resistors and switches.

FIG. 4 shows a further preferred embodiment of the present invention. Resistor strip 420 serves the same function as resistor strip 220 of FIG. 2, that is, equalizing the potential drop between the source of each cell in the row and ground. To select one or more of resistors R401–R420n the appropriate one of transistors T401–T420n is turned on, while all other resistors are turned off as described previously. The output of each of these transistors are coupled, in parallel, to programming resistor strip 450. The source is then grounded through one of the transistors T451–T450n, such that the source is grounded through, in addition to the appropriate resistors in resistor strip 420, none, one, or more of resistors R451–R450n in order to provide for programming to different levels, as described above in reference to resistor steps 350 of FIG. 3. Thus, the embodiment of FIG. 4 provides for programming to different levels through use of a single voltage, using one additional resistor strip 450 for each of the resistors strips 420.

It will be noted that many modifications to the embodiments of the invention described herein can be achieved. For example, as described above, it will typically be desirable to have a ground contact on both sides of the rows for the embodiments shown in FIGS. 3 and 4. In such a case, in addition to adjusting the resistance of the resistors along the strips 320, and 420 along each side such that the source to ground resistance is approximately equal, for the parallel coupling to ground, the resistance of each resistor in the strips 350 is adjusted so that the resistance is approximately equal for each programming level. This can be accomplished as described herein by insuring that the total resistance encountered along the common diffusion region and along the equalizing resistors is approximately equal on both of the two parallel couplings to ground for all cells e.g., a resistance of 16R between each source and the programming resistor strips 350 and 450 of FIGS. 3 and 4 on both sides. Alternatively, the number of resistors and resistance values of the resistors both in the equalizing resistor strips and programming resistor strips can have differing resistance values, so long as a source to ground path is provided for each cell, and for each level, having an approximately equal equivalent resistance as all other cells for each programming level. In this regard, note that the functions of equalizing the series resistance and the function of providing for programming to different levels need not be accomplished separately, with a given resistor strip performing only one function or the other. Rather, any combination of resistors, however arranged, can provide for an approximately equal source to ground resistance for each level. It should be noted that in the embodiments providing for programming to several levels with a single control gate voltage, that single voltage can be higher than that normally provided for binary cells, to increase the programming to any desired levels.

Other benefits are provided by the present invention. For example, in some electrical erase schemes, for example where the source is coupled to a supply voltage while the gate is coupled to a negative voltage, the present invention provides for a tighter distribution after erase since the voltage difference between the floating gate and the control gate will be more uniform. Additionally, the hole trapping in the gate dielectric will be more uniform. As an additional benefit, as described above, the present invention will result in a stronger and more uniform negative feedback effect.

The present invention is not necessarily limited to the array disclosed herein, or to use during programming and read. For example, use of the teachings of the present invention is advantageous whenever devices are coupled in series with more than an insignificant resistance between the devices and whenever an operation has a sufficient current flow to cause a non-negligible voltage drop between each of the devices. Thus, a novel method and apparatus has been disclosed for minimizing the series resistance effect. The present invention provides for uniform threshold distribution which is particularly advantageous in multi-level cells. Additionally, the present invention provides for more uniform read threshold voltages, and for tighter distributions after erase. The present invention also provides a means for programming to different levels using a single programming voltage.

What is claimed is:

1. An array of MOS devices comprising:
   a plurality of MOS devices, each of said MOS devices having a first region and a control gate, wherein said first regions of said plurality of MOS devices are coupled in series to a first node;
   a plurality of first resistors coupled to said first node and a first potential; and,
   a plurality of first switches coupled to said first potential and said first node, and disposed between each of said plurality of said first resistors, such that said first node is switchably coupled to said first potential through one or more of said first resistors.

2. The array as described in claim 1 wherein said first potential is a ground potential.

3. The array as described in claim 1 wherein each of said MOS devices is an electrically programmable memory device further comprising a floating gate, and wherein said first region comprises a source region.

4. The array as described in claim 1 wherein all of said first resistors each have an approximately equal resistance value, and wherein said resistance value is approximately equal to an average resistance between said first regions of adjacent ones of said electrically programmable memory devices.

5. An array of MOS devices comprising:
   a plurality of MOS devices, each of said MOS devices having a first region and a control gate, wherein said first regions of said plurality of MOS devices are coupled in series to a first node; and, means for selecting a resistance value between said first node and a first potential, wherein each said MOS devices is an electrically programmable memory device further comprising a floating gate, and wherein the resistance value comprises one of a plurality of discrete values.

6. The array as described in claim 5 wherein said first potential is a ground potential.

7. The array as described in claim 6 wherein said first region comprises a source region.

8. A method of programming an electrically programmable memory device, said memory device comprising a plurality of memory cells, each of said memory cells having a first region and a control gate, wherein said first regions of said plurality of memory cells are coupled in series to a first node, said method comprising the steps of:

applying a first potential to said control gate;

coupling said first node to a second potential through a first set of a plurality of first resistors for each of said plurality of cells having a first resistance between said first region and said first node, and coupling said first node to said second potential through a second set of the plurality of first resistors for each of said plurality of cells having a second resistance between said first region and said first node, wherein said first set of resistors and said second set of resistors are selected by enabling one or more of a plurality of first switches, wherein each of said first switches is coupled between the first node and the second potential, and is disposed between each of the plurality of first resistors.

9. The method as described in claim 8 wherein said second potential is a ground potential.

10. A method of programming an electrically programmable memory device, said memory device comprising a plurality of memory cells, each of said memory cells having a first region and a control gate, wherein said first regions of said plurality of memory cells are coupled in series to a first node, said method comprising the steps of:

applying a first potential to said control gate; and, providing a first resistance value between said first node and a second potential, wherein said first resistance value is one of a plurality of discrete values, and wherein said first resistance value depends upon a second resistance between said first region of said cell being programmed and said first node.

11. The method as described in claim 10 wherein said second potential is a ground potential.

\* \* \* \* \*

UNITED STATES PATENT AND TRADEMARK OFFICE
CERTIFICATE OF CORRECTION

PATENT NO.    : 5,548,549
DATED         : August 20, 1996
INVENTOR(S)   : Tong-Chern Ong It is certified that error appears in the above-identified patent and that said Letters Patent is hereby corrected as shown below:

In column 4 at line 18 delete "steps" and insert --strips--

In column 9 at line 41 delete "steps" and insert --strips--

Signed and Sealed this

Fourth Day of February, 1997

Attest:

BRUCE LEHMAN

Attesting Officer

Commissioner of Patents and Trademarks